United States Patent [19]
Chen et al.

[11] Patent Number: 5,927,995
[45] Date of Patent: Jul. 27, 1999

[54] REDUCTION OF THREADING DISLOCATIONS BY AMORPHIZATION AND RECRYSTALLIZATION

[75] Inventors: Yong Chen; Richard P. Schneider, Jr., both of Mountain View; Shih-Yun Wang, Palo Alto, all of Calif.

[73] Assignee: Hewlett-Packard Company, Palo Alto, Calif.

[21] Appl. No.: 08/833,813

[22] Filed: Apr. 9, 1997

[51] Int. Cl.$^6$ .................................................. H01L 21/265
[52] U.S. Cl. ........................ 438/517; 438/518; 438/522
[58] Field of Search .......................... 438/46, 514, 517, 438/518, 520, 522, 530, 479, 918, 938, 483, 486; 148/DIG. 3, DIG. 65, DIG. 83, DIG. 85; 427/553, 523, 526

[56] References Cited

U.S. PATENT DOCUMENTS

| 4,617,066 | 10/1986 | Vasudev | 438/514 |
| 4,863,877 | 9/1989 | Fan et al. | 437/22 |
| 5,223,445 | 6/1993 | Fuse | 638/525 |
| 5,290,393 | 3/1994 | Nakamura | 438/479 |
| 5,766,695 | 6/1998 | Nguyen et al. | 438/919 |

FOREIGN PATENT DOCUMENTS 08 222812 8/1996 Japan.

OTHER PUBLICATIONS

Anonymous, "Method to Change Resistivity Type of Semiconductors. May 1979." IBM Technical Disclosure Bulletin, vol. 21, No. 12, May 1979, pp. 5041.

Tan, H.H. et al. "Ion Implantation Processing of GaN Epitaxial Layers", Proceedings of First Symposium on II–V Nitride Materials . . . Los Angeles, California 6–8 May 1996, pp. 142–148.

Zolper et al "Ca SI O Ion Implantation of GaN" Appl–Phys. Lett. vol. 68. Apr. 1, 1996.

Tan et al "Annealing of Ion Implanted Gallium or Nitride". App. Phys. Letts., vol. 72, No. 10, Mar. 9, 1998.

Liu et al "Ion Implantation at Liquid Nitrogen Temperature Structural. Characteristics and Amorphization", Physics Review B, vol. 57, No. 4. Jan. 15, 1998.

S.J. Pearton et al, "Ion Implantation and Isolation of GaN". Appl. Phys. Lett., vol. 67, No. 10, Sep. 4, 1995.

S.C. Binari et al., "H, HE, and N Implant Isolation of N–type GaN" J. Appl. Phys., vol. 78, No. 5, Sep. 4, 1995.

Tan et al "Damage to Epitaxial GaN Layers by Silicon Implantation" Appl. Phys. Lett. 69(16), Oct. 14, 1996.

*Primary Examiner*—Savitri Mulpuri

[57] ABSTRACT

A method for providing an epitaxial layer of a first material over a substrate comprising a second material having a lattice constant different from that of the first material. In the method of the present invention, a first layer of the first material is grown on the substrate. A portion of the first layer is treated to render that portion amorphous. The amorphous portion is then annealed at a temperature above the recrystallization point of the amorphous portion, but below the melting point of the crystallized portion of the first layer thereby recrystallizing the amorphous portion of the first layer. The first layer may rendered amorphous by ion implantation. The method may be used to generate GaN layers on sapphire having fewer dislocations than GaN layers generated by conventional deposition techniques.

4 Claims, 2 Drawing Sheets

REDUCTION OF THREADING DISLOCATIONS BY AMORPHIZATION AND RECRYSTALLIZATION

FIELD OF THE INVENTION

The present invention relates to integrated circuit fabrication, and more particularly, to a method for reducing the dislocations that occur when a layer is deposited and crystallized on a substrate having a lattice constant that differs substantially from the layer being deposited.

BACKGROUND OF THE INVENTION

A common operation in integrated circuit fabrication is the deposition of a layer of crystalline material having a first lattice constant on a substrate consisting of a layer of material having a second lattice constant. If the first and second lattice constants differ significantly, the deposited layer contains dislocations resulting from the mismatch in the lattice constants. Such dislocations degrade the performance of the devices in which they appear. In addition, these dislocations can lead to further dislocations in subsequently deposited layers.

For example, GaN layers are particularly useful in constructing lasers in the blue and green wavelengths. These layers are typically deposited on a sapphire substrate. The lattice constants of GaN and sapphire differ by 13%. As a result, the GaN layer can have as many as $10^9$ dislocations per $cm^2$.

Broadly, it is the object of the present invention to provide an improved method for depositing a layer of crystalline material on a crystalline substrate having a substantially different lattice constant from that of the deposited layer.

It is a further object of the present invention to provide a method for depositing GaN on sapphire which results in fewer dislocations in the GaN layer than obtained with conventional deposition techniques.

These and other objects of the present invention will become apparent to those skilled in the art from the following detailed description of the invention and the accompanying drawings.

SUMMARY OF THE INVENTION

The present invention comprises a method for providing an epitaxial layer of a first material on a substrate comprising a second material having a lattice constant different from that of the first material. In the method of the present invention, a first layer of the first material is grown on the substrate. A portion of the first layer is treated to render that portion amorphous. The amorphous portion is then annealed at a temperature above the recrystallization temperature of the amorphous portion, but below the melting point of the crystallized portion of the first layer thereby recrystallizing the amorphous portion of the first layer. The first layer may rendered amorphous by ion implantation. The method may be used to generate GaN layers on sapphire having fewer dislocations than GaN layers generated by conventional deposition techniques.

DETAILED DESCRIPTION OF THE INVENTION

Figure 1:
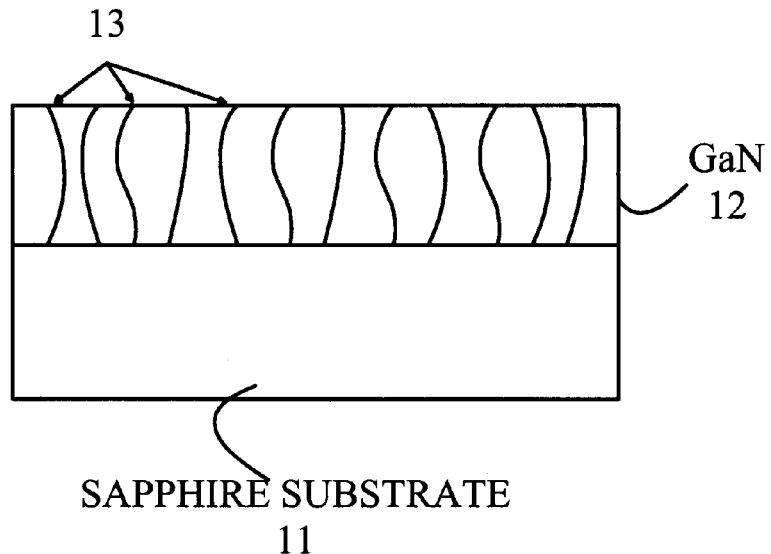
FIGS. 1–4 are cross-sectional views of a GaN layer deposited by the method of the present invention.

The present invention may be more easily understood with reference to epitaxial growth of a layer 12 of GaN on a sapphire substrate 11 as shown in FIG. 1. The lattice mismatch between the GaN and sapphire results in a high density of dislocations. Exemplary dislocations are shown at 13. If additional epitaxial layers were grown on layer 12, these dislocations would propagate through the new layers.

Figure 2:
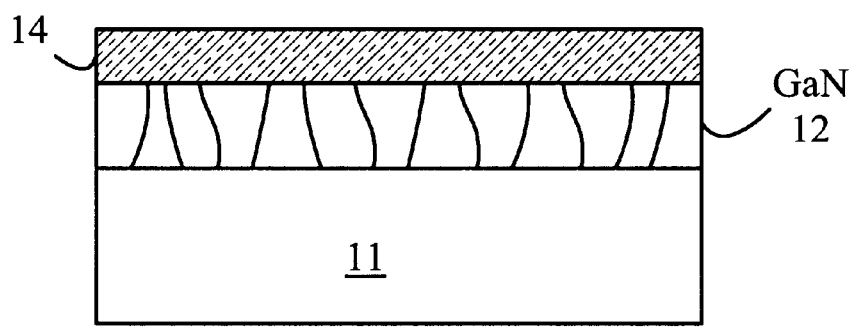
Figure 3:
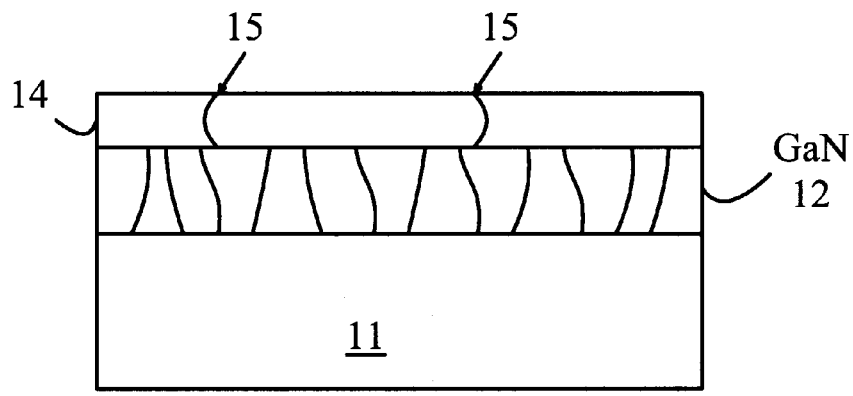

The present invention provides a GaN buffer zone with a significantly lower density of dislocations. The buffer zone is created by destroying the crystal structure of the upper portion of GaN layer 12 by ion implantation to form an amorphous layer 14 as shown in FIG. 2. Amorphous layer 14 is then recrystallized by annealing structure 10 at a temperature above the recrystallization point of amorphous layer 14, but below the melting point of GaN layer 12. The resulting layer has been found to have substantially fewer dislocations as shown at 15 in FIG. 3.

The extent to which the dislocations can be reduced in layer 14 depends on the thickness of layer 14. If layer 14 is too thin, the surface properties of the underlying layer will dominate the recrystallized structure, and hence, the dislocations will not be removed. In the case of GaN, layer 14 should be greater than 50 nm.

As noted above, the preferred method for creating the amorphous region is ion implantation. The choice of ion and energy will, in general, depend on the epitaxial layer being bombarded. In the case of GaN, the preferred ion is nitrogen which is implanted with an energy of 20 keV and a density of at least $3 \times 10^{16}/cm^2$ to generate an amorphous region having a depth of approximately 60 nm. Higher implant energies result in thicker and deeper amorphous layers.

Figure 4:
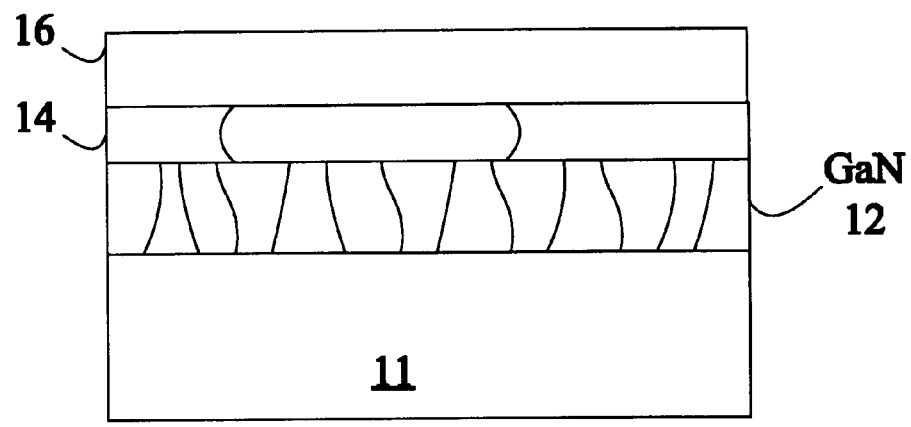

In the preferred embodiment of the present invention an epilayer is grown on top of the recrystallized layer as shown at 16 in FIG. 4. It has been found experimentally that the epilayer has even fewer defects than the recrystallized layer.

Various modifications to the present invention will become apparent to those skilled in the art from the foregoing description and accompanying drawings. Accordingly, the present invention is to be limited solely by the scope of the following claims.

What is claimed is:

1. A method for providing an epitaxial layer of a first material on a substrate comprising a second material having a lattice constant different from that of said first material, said method comprising the steps of:

growing a first layer of said first material on said substrate;

treating a portion of said first layer by ion implanting said portion of said first layer thereby rendering said treated portion amorphous; and annealing said amorphous portion at a temperature above the recrystallization point of said amorphous portion thereby recrystallizing said amorphous portion of said first layer, wherein said step of ion implanting comprises ion implanting nitrogen atoms, wherein said first substrate comprises sapphire and said first material comprises GaN.

2. The method of claim 1 wherein said ion implanted layer is greater than 50 nm in thickness.

3. The method of claim 1 wherein said step of annealing said portion of said first layer comprises heating said portion of said first layer to a temperature above the recrystallization temperature of said amorphous layer, but below the melting point of crystalline GaN.

4. The method of claim 1 further comprising the step of growing a second layer of said first material on said first layer after said step of annealing said portion of said first layer.

* * * * *